United States Patent [19]
Shufflebotham et al.

[11] Patent Number: 5,847,918
[45] Date of Patent: Dec. 8, 1998

[54] ELECTROSTATIC CLAMPING METHOD AND APPARATUS FOR DIELECTRIC WORKPIECES IN VACUUM PROCESSORS

[75] Inventors: Paul Kevin Shufflebotham, San Jose; Michael S. Barnes, San Francisco, both of Calif.

[73] Assignee: Lam Research Corporation, Fremont, Calif.

[21] Appl. No.: 542,959

[22] Filed: Oct. 13, 1995

Related U.S. Application Data

[63] Continuation-in-part of Ser. No. 536,923, Sep. 29, 1995, abandoned.

[51] Int. Cl.$^6$ .................................................. H02N 13/00
[52] U.S. Cl. ......................... 361/234; 361/235; 279/128
[58] Field of Search ............................... 361/230, 233, 361/234, 235; 269/8, 903; 279/128

[56] References Cited

U.S. PATENT DOCUMENTS

| | | | |
|---|---|---|---|
| 4,078,851 | 3/1978 | Albanese | 350/96.1 |
| 4,897,171 | 1/1990 | Ohmi et al. | 204/298 |
| 5,179,498 | 1/1993 | Hongoh et al. | 361/234 |
| 5,250,137 | 10/1993 | Arami et al. | 156/345 |
| 5,382,311 | 1/1995 | Ishikawa et al. | 156/345 |
| 5,459,632 | 10/1995 | Birang et al. | 361/234 |
| 5,460,684 | 10/1995 | Saeki et al. | 156/345 |
| 5,467,249 | 11/1995 | Barnes et al. | 361/234 |
| 5,478,429 | 12/1995 | Komino et al. | 156/345 |
| 5,491,603 | 2/1996 | Birang et al. | 361/234 |
| 5,525,159 | 6/1996 | Hama et al. | 118/723 I |
| 5,529,657 | 6/1996 | Ishii | 156/345 |
| 5,557,215 | 9/1996 | Saeki et al. | 324/765 |
| 5,569,350 | 10/1996 | Osada et al. | 156/345 |
| 5,571,366 | 11/1996 | Ishii et al. | 156/345 |
| 5,591,269 | 1/1997 | Arami et al. | 118/723 R |

*Primary Examiner*—Fritz Fleming
*Attorney, Agent, or Firm*—Lowe Hauptman Gopstein Gilman & Berner

[57] ABSTRACT

A dielectric workpiece is clamped to a holder in a vacuum plasma processor chamber by applying the plasma to a surface of the workpiece exposed to the plasma simultaneously with applying a relatively high voltage to an electrode on the holder. The electrode is in close proximity to a portion of the workpiece not exposed to the plasma so (1) the electrode is at a voltage substantially different from the plasma, (2) electrostatic charge is applied to the exposed surface by the plasma, and (3) an electrical conducting path is provided via the plasma from the electrostatic charge to a terminal at a potential substantially different from the voltage applied to the electrode. Sufficient electrostatic clamping force is applied through the thickness of the workpiece by a voltage difference between the DC voltage applied to a single electrode and charge applied by the plasma to the exposed face to hold the substrate on the holder.

37 Claims, 3 Drawing Sheets

ELECTROSTATIC CLAMPING METHOD AND APPARATUS FOR DIELECTRIC WORKPIECES IN VACUUM PROCESSORS

RELATED APPLICATIONS

The present application is a continuation-in-part of a application entitled "Electrostatic Clamping Method and Apparatus for Dielectric Workpieces in Vacuum Processors" of Paul Kevin Shufflebotham and Michael S. Barnes, filed Sep. 29, 1995, Ser. No. 08/536,923, now abandoned.

FIELD OF INVENTION

The present invention relates generally to a method of and apparatus for clamping dielectric workpieces in vacuum processors and more particularly to such a method and apparatus wherein the dielectric workpiece is electrostatically clamped by a voltage applied to an electrode electrically insulated from ions in the processor.

BACKGROUND ART

Vacuum plasma processors include a vacuum chamber containing a workpiece holder, i.e., chuck, for carrying a workpiece having an exposed surface which is etched and/or on which materials are deposited. The etching and depositing are provided inter alia by ions in the chamber resulting from introduction into the chamber of a suitable gas and the application of an r.f. field to that gas.

The workpiece temperature can be controlled by applying an inert gas, such as helium, to the back of the workpiece. Typically, the workpieces are relatively thin substrate plates made of electrical conducting materials (i.e., metals), semiconductors or dielectrics. To hold such a workpiece in place against the pressure of the gas pushing on the back of the workpiece, the workpiece must be clamped to the chuck.

Vacuum plasma processing of dielectric substrate workpieces has assumed great importance with the introduction of flat panel displays having panels with relatively large dimensions, measured in feet. In the past, dielectric panel workpieces have been mechanically held in place along edges thereof using a metal or ceramic clamp ring pushing down on a top face of the workpiece in proximity to its edges. This prior art arrangement has numerous drawbacks, namely: (1) the clamp ring pressing down on the top surface of the panel is likely to cause damage to the panel by causing particles to be removed from the panel and possibly chipping or cracking of the panel, with resulting damage to the panel, as well as release of contaminates into the chamber environment; (2) some portion of the panel edges are covered by the clamp, reducing the usable panel surface area since ions cannot be applied to the surfaces in contact with the clamp; (3) since the panel is only held down along its edges while gas is provided to the back side of the panel, the panel is pushed up into the vacuum chamber, causing the panel to be warped and bowed upward in its center, causing non-uniform heat transfer to the substrate holder, to adversely affect process performance and control; and (4) edge clamping does not help to flatten a warped panel. Hence, it would be desirable to use electrostatic chucks to hold dielectric substrates in situ in vacuum plasma processors. However, to our knowledge, there are no presently available devices or methods of clamping a dielectric substrate to a holder in a vacuum plasma processor, without using some kind of mechanical clamp.

Electrostatic chucks have been successfully used in the prior art to hold semiconducting and conducting substrate workpieces in place in vacuum processing chambers. Exemplary of a wide range of designs employing electrostatic chucks for this purpose are found in Tojo et al., U.S. Pat. No. 4,480,284, Suzuki, U.S. Pat. No. 4,692,836, Lewin et al., U.S. Pat. No. 4,502,094, Wicker et al., U.S. Pat. No. 4,724,510, Abe, U.S. Pat. No. 4,384,918 and Briglia, U.S. Pat. No. 4,184,188. All of these prior art electrostatic chucks are based on the principle of electric charge separation in the clamped substrate. Such charge separation can be provided in conducting workpieces, e.g. those made of metal and semiconducting materials, but cannot be attained in substrate workpieces consisting of dielectric materials. Despite the lack of a prior art method and apparatus for electrostatically clamping a dielectric to a holder in a vacuum plasma processor, it would be highly desirable to provide such an electrostatic chuck.

If an electrostatic chuck could be developed for holding flat dielectric panel substrate workpieces to a workpiece holder in a vacuum processor, it would preferably satisfy the following criteria: (1) high uniform holding forces; (2) high thermal conductivity through the electrostatic chuck and across the panel; (3) substantial resistance to mechanical abrasion; (4) the ability to clamp effectively in the range from room temperature to relatively high temperatures, of about 400° C.; (5) vacuum compatibility, an attribute which is not true of many plastics; and (6) compatibility with highly chemically active corrosive plasma environments.

It is, accordingly, an object of the present invention to provide a new and improved method of, and apparatus for, clamping a dielectric workpiece in a vacuum chamber to a holder in the chamber.

Another object of the invention is to provide a new and improved method of, and apparatus for, holding a dielectric substrate in place in a vacuum processing chamber without the use of a mechanical clamp.

An additional object of the invention is to provide a new and improved method of, and apparatus for, holding a dielectric workpiece in a vacuum plasma processing chamber in a way to minimize the likelihood of particles being dislodged from the workpiece by the holding apparatus.

An additional object of the invention is to provide a new and improved method of, and apparatus for, holding a dielectric substrate in a vacuum processing chamber in a manner to minimize the likelihood of damage being done to the workpiece by the holding or clamping arrangement.

A further object of the invention is to provide a new and improved method of, and apparatus for, holding a dielectric substrate in place in a vacuum processing chamber in a way to minimize chipping and/or cracking of the workpiece by the holding arrangement.

A further object of the invention is to provide a new and improved method of, and apparatus for, holding a glass dielectric substrate, of the type employed in flat panel displays, in place in a vacuum processing chamber in such a manner that bowing of the substrate is minimized even though a pressure is applied to the substrate backside by a gas for controlling the substrate temperature.

An additional object of the present invention is to provide a new and improved method of and apparatus for holding a dielectric substrate, such as employed in a large area flat panel display, in place in a vacuum processing chamber in such a way that substantially the entire unexposed back face of the substrate is pulled to the holding device to thereby reduce warping of a previously warped substrate.

An additional object of the invention is to provide a new and improved electrostatic chuck for workpieces in a vacuum chamber.

Still another object of the invention is to provide a new and improved vacuum chamber including an improved electrostatic chuck particularly adapted for dielectric substrates.

The Invention

In accordance with one aspect of the invention, a dielectric workpiece is clamped to a holder in a vacuum plasma processor chamber by applying the plasma to a surface of the workpiece exposed to the plasma simultaneously with applying a relatively high voltage to an electrode arrangement on the holder. The electrode is physically arranged and is in close proximity to a portion of the workpiece not exposed to the plasma so (1) the electrode is at a voltage substantially different from the plasma, (2) electrostatic charge is applied to the exposed surface by the plasma, and (3) an electrical conducting path is provided via the plasma from the electrostatic charge to a terminal at a potential substantially different from the voltage applied to the electrode. An electrostatic force is thereby developed between the workpiece and the holder to clamp the workpiece to the holder.

In the preferred embodiment, there is a monopolar electrode arrangement and the voltage is DC. Sufficient electrostatic clamping force to hold the substrate on the holder is applied through the thickness of the workpiece by a voltage difference between the DC voltage applied to the electrode and the DC voltage due to the charge applied by the plasma to the exposed face.

Another aspect of the invention is directed to the combination of a vacuum plasma processor chamber for applying gaseous ions having a potential substantially equal to a reference potential to a surface of a dielectric workpiece and an electrostatic clamp in the chamber for holding the workpiece in situ in the chamber. The electrostatic clamp has an electrode maintained at a potential substantially different from the reference potential. The potential at which the electrode is maintained is such that the electrode is positioned relative to the workpiece surface while a plasma is being applied to the dielectric workpiece surface so electric charge applied to the surface by the plasma forms part of an electrical conducting path from the surface to a terminal at the reference potential via the plasma. Thereby, the charge on the dielectric workpiece surface is at a potential approximately equal to the reference potential and a substantial voltage is established between the electrode and the charge on the surface. The substantial voltage establishes an electrostatic clamping force between the electrode and substrate for holding the workpiece in situ on the clamp. A fluid supplied to the clamp controls the clamp and workpiece temperatures. The invention is particularly applicable to workpieces consisting of a glass substrate having a substantially planar exposed face.

In the preferred embodiment, the electrode comprises a metal plate having a substantially planar face facing the rear face of the substrate and located in a plane parallel to the substrate exposed surface. An electric insulator surrounds all surfaces of the electrode, except portions of the planar face of the plate facing the workpiece (i.e. substrate) for preventing the electrode from being in electric contact with ions in the chamber.

In one configuration, referred to as a monopolar device, the electrode planar face is bare so it and the rear face of the substrate abut. In a second configuration, the electrode planar face is covered by a protective coating of material including electrical conductors (e.g. the material is a semiconductor or a semi-metal) and the protective coating has a face abutting the rear face of the substrate.

Hence, the present invention provides an electrostatic chuck in a vacuum plasma processor chamber for dielectric substrates, wherein the chuck uses electrostatic forces of attraction to pull a substrate workpiece onto a surface of a holder. The electrostatic forces are generally uniformly applied across the entire back surface of the substrate, without the need for any front or side mechanical contact.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENTS

Figure 1:
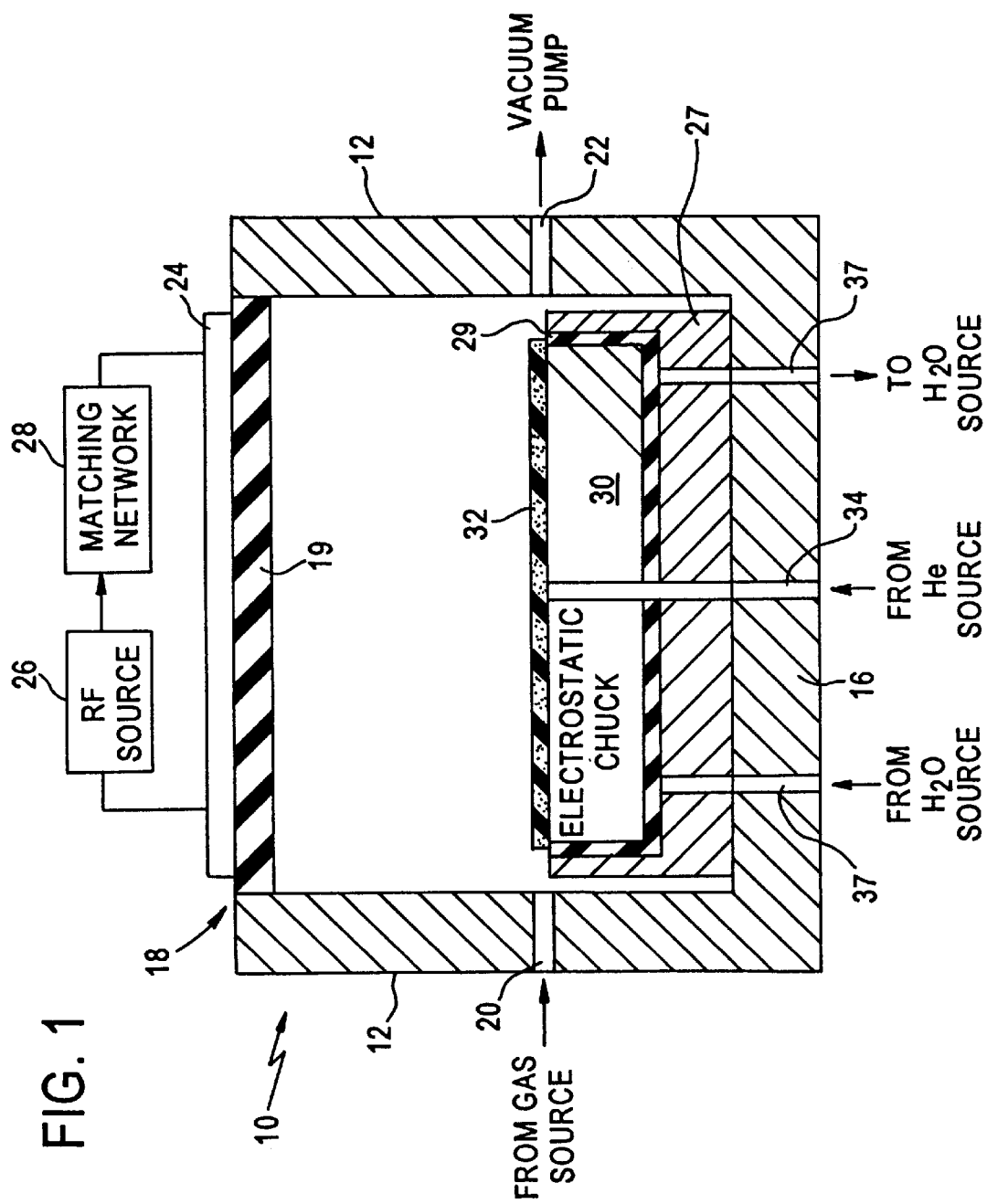
FIG. 1 is a schematic view of a vacuum plasma processor including an electrostatic chuck for holding a glass, dielectric workpiece sheet in situ.

Reference is now made to FIG. 1 of the drawing, wherein a plasma processor that can be used for etching a dielectric substrate or for depositing films on the dielectric substrate is illustrated as including vacuum chamber 10, that can be shaped as a cylinder having a grounded metal wall and end faces but is preferably configured as a right parallelepiped having electrically grounded, sealed exterior surfaces formed by rectangular metal, preferably anodized aluminum, sidewalls 12. Vacuum chamber 10 also includes rectangular metal, preferably anodized aluminum, bottom end plate 16 and rectangular top end plate structure 18, including dielectric window structure 19. Sealing of these exterior surfaces of chamber 10 is provided by conventional gaskets (not shown).

A suitable gas that can be excited to a plasma is supplied to the interior of chamber 10 from a gas source (not shown) via port 20 in sidewall 12. The interior of chamber 10 is maintained in a vacuum condition, at a pressure typically in the range of 0.5–100 milliTorr, by a vacuum pump (not shown) connected to port 22 in sidewall 12. The gas in vacuum chamber 10 is excited to a plasma condition by a suitable electric source, such as planar coil 24, mounted immediately above window 19 and excited by r.f. source 26 via matching network 28 that is resonant to the frequency of source 26; it is to be understood however that any suitable method of plasma generation can be employed.

Electrostatic chuck 30 is fixedly mounted in chamber 10 on a support structure including grounded metal base 27 that is electrically decoupled from the chuck by electrical insulating sheets 29; base 27 is fixed to bottom end plate 16. Chuck 30 is particularly designed to selectively hold workpiece 32 consisting of a non-plastic dielectric, typically a flat glass substrate sheet of a flat panel display, e.g., near zero alkali barlaborosicilicite glass 7059 or a boroaluminosilicate glass 1733 having a near zero alkali composition, both available from Corning Glass Works, Precision Flat Glass Business, Corning, N.Y. These glass sheets have a nominal thickness of 1.1 mm, a thickness tolerance of ±0.1 mm, and are very smooth, each having a maximum peak to peak roughness of 0.02 microns. The glass substrate sheet, as produced, may be slightly warped or wavy; the aforementioned glass sheets have a maximum height to length warp ratio, when annealed, of 0.00075 mm/mm, a maximum height to waviness ratio, when annealed, of 0.002–0.003 mm/mm and a room temperature dielectric constant of 5.84. After going through various process steps, especially deposition, these parameters can get much worse, resulting in a greater need to flatten substrate sheet 32 during plasma processing thereof in chamber 10.

In one embodiment, the temperature of workpiece 32 is controlled to be between 25°–400° C. by supplying helium gas from a suitable source (not shown) via conduit 34 to the workpiece back face, i.e., to the face of the glass substrate not exposed to the ions in processing chamber 10 and by supplying a coolant liquid, e.g., a mixture of water and ethylene glycol, to chuck 30 via conduits 37 from a suitable source (not shown). Typically, the pressure of the helium gas applied to the back face of workpiece 32 is in the 5–15 Torr range and the helium flow rate through conduit 34 is in the 5–70 sccm range. The helium flows from the source through a flow controller and a pressure transducer into conduit 34 via a stem and one arm of a "T" connection, the other arm of which is connected through an orifice having a controlled opening to a pump.

Chuck 30 is constructed so the back face of workpiece 32 abuts a flat planar face of the chuck, except in portions of the chuck face that are grooved. Chuck 30 applies a force to the workpiece so the exposed surface of the workpiece is flat and lies in a plane substantially parallel to the chuck flat planar face. This result is achieved even though workpiece 32 may be warped or wavy when put onto the chuck and despite the tendency of the helium gas flowing through conduit 34 to bow the workpiece upwardly into chamber 10 away from the flat planar face of chuck 30. Chuck 30 is also constructed so the helium gas contacts a substantial portion of the back face of workpiece 32 even though the back face of the workpiece abuts ungrooved portions of the flat planar face of chuck 30. Chuck 30 is also constructed so a high thermal conductivity path is provided through the chuck to substrate 32 from the cooling liquid flowing through conduits 37.

Figure 2:
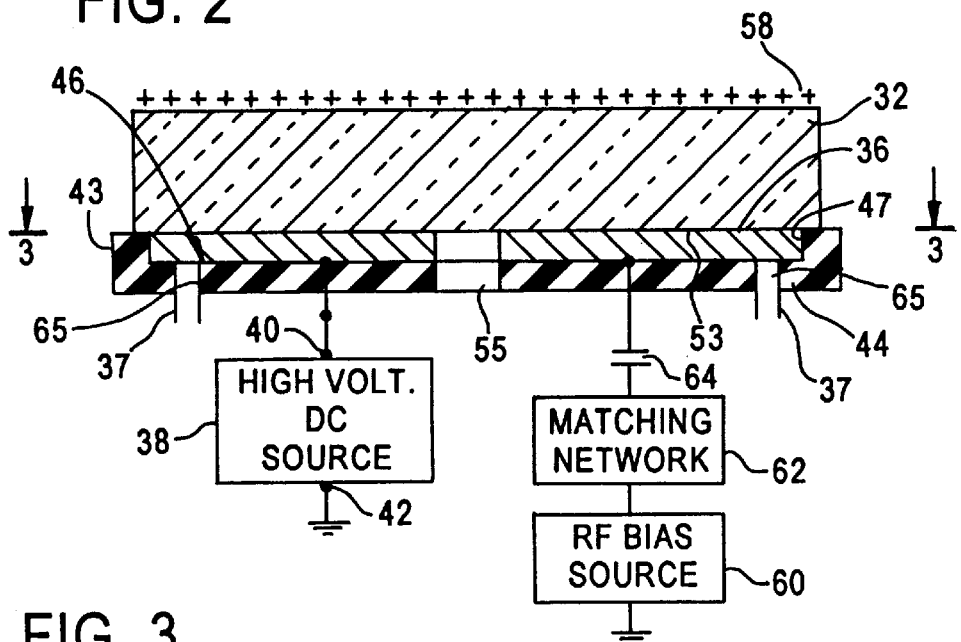
FIG. 2 is a side sectional view of a monopolar electrostatic chuck embodiment particularly adapted to be used in the processor of FIG. 1, in combination with the glass, dielectric workpiece sheet.
Figure 3:
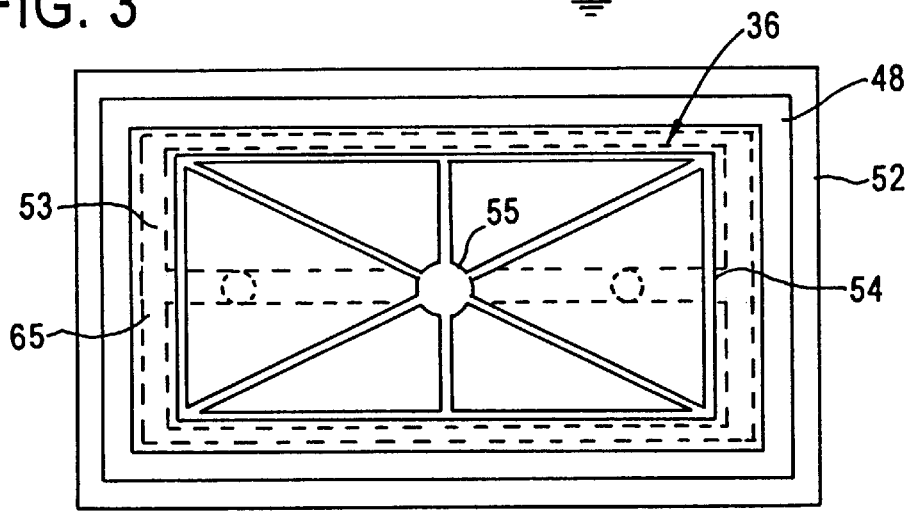
FIG. 3 is a top view of the structure, illustrated in FIG. 2, without the glass, dielectric workpiece sheet in situ.

As illustrated in FIGS. 2 and 3, electrostatic chuck 30 is a monopolar device having only one electrode formed as metal plate 36, connected to high voltage terminal 40 of DC source 38, including a low pass r.f. rejection filter (not shown). The voltage at terminal 40 is typically several thousand volts, e.g., 5000 volts, relative to the voltage of source 38 at grounded terminal 42, connected to a metal wall of housing 10. Terminal 42, chamber 10 and the plasma in the chamber are all at about the same DC ground (i.e., reference) potential. Voltage source 38 can be constructed so terminal 40 is at either a negative or positive voltage relative to the voltage at grounded terminal 42. Typically the voltage at terminal 40 is negative with respect to terminal 42 to attract relatively low mobility positive ions to the exposed face of workpiece 32; this is advantageous because it reduces the likelihood of deleterious effects on power supply 38. Hence, supply 38 can be considered as a clamping source.

A radio frequency bias voltage is also supplied to chuck 30 for ion energy control and substrate backside He cooling. To this end r.f. source 60 is connected via matching network 62 and series DC blocking capacitor 64 to plate 32 of chuck 30.

Plate 36, preferably made of aluminum, is surrounded by dielectric electric insulator body 44, made of a material which does not out-gas (usually not a plastic and preferably a ceramic). Body 44 prevents electrode plate 36 from electrically contacting the ions in chamber 10 so there is a substantial DC potential difference between the electrode and ions in the chamber. To this end, insulator body 44 is shaped as a plate having recess 46 therein. Metal plate 36 is located in recess 46 such that peripheral edges of the plate abut interior walls 47 of flanges 48 of body 44 and workpiece substrate 32 is sized relative to plate 36 so the substrate completely covers the plate 36 upper surface.

To enable helium gas flowing through conduit 34 to contact a substantial portion of the back face of glass workpiece 32, smooth planar upper face 53 of plate 36 is provided with spaced, interconnected grooves 54 (FIG. 3), all of which are in fluid flow relation with each other and conduit 34 that effectively extends through chuck 30 since the chuck includes central bore 55 to which the conduit and grooves are connected. When workpiece 32 is clamped in place on chuck 30, the exposed planar upper face of the workpiece extends in a plane parallel to upper face 53. Body 44 includes passages 65, in fluid flow relation with conduits 37 so the coolant liquid flows through the passages. Heat is readily transferred from workpiece substrate 32 to the coolant in passages 65 since insulator body 44 and metal plate 36 have a high thermal conductivity and there is a short distance between the passages and workpiece 32.

In operation, a glass dielectric substrate workpiece 32, as described supra, is placed on electrode plate 36 when the voltage of DC source 38 connected to electrode 36 is zero by virtue of the DC source being disconnected from its energizing power supply (not shown). After workpiece 32 has been placed on electrode plate 36 in such a manner that the entire electrode is completely surrounded by dielectric body 44 or workpiece 32, source 38 is connected to its energizing power supply. Charge layer 58, at a reference potential close to the ground voltage of chamber 10, is developed on the exposed, top surface of glass workpiece 32 as a result of the exposed surface being in contact with ions at the reference potential in chamber 10. When source 38 is connected to its energizing power supply, a displacement current flows from terminal 40 and electrode plate 36 to the charge layer 58 on the exposed top layer of workpiece 32, thence through the plasma in chamber 10, to the walls of the chamber and to ground terminal 42 of source 38. This displacement current causes a charge to be established across the thickness of substrate workpiece 32.

The voltage of source 38 is sufficiently high that the charge across the thickness of workpiece substrate 32 produces an attracting force across the workpiece to clamp the substrate to the upper face 53 of plate 36. The clamping pressure, P, applied to workpiece 32 is:

$$P = \frac{F}{A} = \frac{\epsilon_r^2 \epsilon_0 V^2}{2d^2}$$

where

F is the attracting force,

A is the area of substrate 32 abutting upper face 53 of plate 36, $\epsilon_r$ is the permittivity of workpiece 32, $\epsilon_o$ is the permittivity of free space, V is the voltage of source 38, and d is the thickness of substrate workpiece 32.

The value of voltage source 38 required to clamp glass dielectric workpiece 32, typically being on the order of 5000 volts, is considerably higher than the voltage required to clamp a semiconductor or metal workpiece to a monopolar electrostatic clamp. This is because of the high voltage necessary to establish the clamping pressure from electrode plate 36 across the thickness of workpiece 32 to the charge layer on exposed face of the workpiece. Usually the pressure applied to workpiece 32 should be about twice the pressure applied to the backside of the workpiece by the He flowing through conduit 34.

Figure 4:
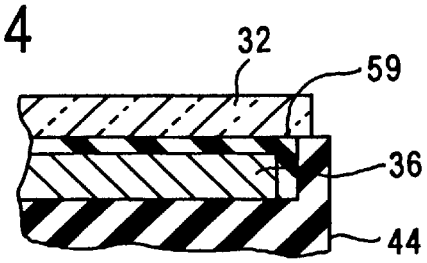
FIG. 4 is a side view of a modification of the structure illustrated in FIG. 2, including a semiconductor or semi-metal layer over the monopolar electrode.

The electrode illustrated in FIG. 2 includes a bare upper metal face abutting the back face of substrate plate 36. The electrode can be modified to include protective coating 59, FIG. 4, that can be a very thin dielectric (e.g. 0.1 mm thick) or a material including electrical conductors made of a semi-metal, e.g., $Al_2O_3$ doped with $TiO_2$, or a semiconductor, to enhance the mechanical wear characteristics of the electrode, as well as to reduce electric breakdown and/or leakage current due to plate 36 being exposed to plasma. If such a coating 59 is a semi-metal or semiconductor, no change in the voltage of source 38 is necessary, but if the coating is a thin dielectric sheet, the voltage of source 38 is increased as a function of the coating thickness and material dielectric constant and breakdown voltage to provide the required clamping pressure. No change in voltage for a material including conductors is necessary because charge eventually migrates to the top surface of the material abutting the back face of workpiece substrate 32. The increased migration time is not noticeable to a human observer, but can, if appropriate, be so discernible. The migration time depends on the RC time constant of the resistance in the conductors and the capacitance of dielectric workpiece 32.

The invention can be used in processing field effect devices deposited on non-plastic dielectric substrates, e.g. those made of the same type of glass discussed supra. In such a case the high voltage applied across dielectric substrate 32 has no substantial adverse effects on gate dielectrics of the field effect devices. The electrostatic clamp (ESC) voltage is capacitively divided between the small vacuum gap between plate 36 and substrate 32, the substrate and dielectric layers of the devices formed on the substrate surface. Essentially all of the voltage of DC source 38 is developed across the substrate and only a very small amount is developed across the dielectric layer of the field effect device because of the much greater thickness of the substrate than the dielectric layer of the field effect device. For a field effect device having a 300 nm thick nitride gate with a dielectric constant of approximately 6.5 and a –5 kV voltage of source 38 at terminal 40, and a substrate 32 having a thickness of 1.1 mm, the voltage appearing across the gate is 1.2 V, which is much too small to damage the field effect device.

In high density plasma etching, the heat flux in chamber 12 due to ion bombardment on substrate 32 can be significant, requiring active temperature control. Without He backside cooling, the temperature of substrate 32 does not stabilize. At higher bias powers applied by source 60 to chuck 30, and/or longer process times of substrate 32, substrate temperatures eventually exceed 150° C., causing resist reticulation of substrate 32. With cooling, substrate temperatures reach a steady state within 10 to 60 seconds, depending on the level of bias power supplied by source 60 to plate 32. Clamping of substrate 32 by chuck 30 without backside He from the source connected to conduit 34 is not effective in cooling the substrate. The monopolar ESC, combined with backside He cooling, is effective in controlling the temperature of large glass panels.

The thermal conductivity from substrate 32 in chuck 30 depends on the He pressure applied via conduit 34 to the backside of the substrate. By clamping substrate 32 to cooled chuck 30, and using backside He cooling provided by conduit 34, good heat transfer from the substrate to the chuck is provided. This active temperature control of substrate 32 prevents resist reticulation and uncontrolled process variations of substrate 32, as required in the high density plasma environment of chamber 12.

The present monopolar electrostatic clamp can be particularly advantageous for clamping large-area (e.g. 600× 650 mm) dielectric substrates in plasma environments. The monopolar clamp is robust, easily manufactured and has a relatively low cost. The ESC of the present invention can be used to clamp glass substrates up to 600×650 mm against 15 Torr of backside He pressure with terminal 40 of source 38 having a voltage of –5 kV. We have found that active temperature control of large-area glass substrates is important in high density plasma etching to prevent uncontrolled processes and resist reticulation. We have also found that monopolar chuck 30, used in conjunction with backside He cooling, effectively and uniformly controls the temperature of 320×340 mm glass substrates to obtain uniform high density plasma etching of such substrates.

Figure 5:
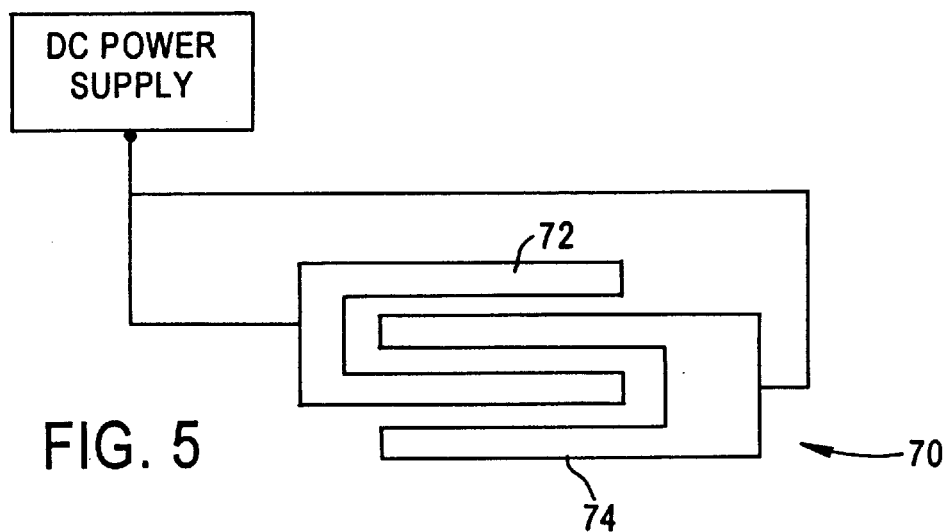
FIG. 5 is a top view of an interdigitated electrode that can be used in the chuck.

While there has been described and illustrated a specific embodiment of the invention, it will be clear that variations in the details of the embodiment specifically illustrated and described may be made without departing from the true spirit and scope of the invention as defined in the appended claims. For example, it is not necessary for the electrostatic monopolar chuck of the invention to include a single electrode. The electrode can have an arbitrary complex pattern of multiple spaced elements all connected to a single electrode of a DC power supply. For example, an interdigitated electrode pattern 70 (FIG. 5) including two spaced electrodes 72 and 74 could replace electrode 38. Both of the interdigitated electrodes would be connected to the same voltage, e.g. –4000 volts, of a single DC power supply 76. Such a configuration remains a single monopolar electrostatic chuck, but has a complex electrode pattern, while using the plasma-induced charge on the dielectric workpiece to perform clamping. Existing interdigitated electrostatic chucks could thereby be converted into monopolar chucks for dielectric workpieces using the principles of the invention.

The principles of the invention can also be extended to a complex electrode arrangement connected to different DC voltages to provide separate local monopolar electrostatic chucks for dielectric workpieces, wherein each chuck includes a different electrode. In such an instance each of the local electrostatic chucks relies on plasma-induced charge to clamp the dielectric workpiece. The voltages can be of the same or different polarities. If the electrode voltage is negative, positive ions in the plasma are accumulated on the dielectric surface above the electrode having the negative voltage to provide the clamping force. If the electrode voltage is positive, electrons and/or negative ions in the plasma are accumulated on the dielectric surface above the electrode having the positive voltage to provide the clamping force.

Because the workpiece is a dielectric, the clamping mechanism is quite different from that of prior art bi-polar chucks for semiconductor and metal workpieces. For dielectric workpieces, charges are accumulated on the dielectric surface from the plasma to provide the clamping force. In contrast, electric field lines extending between the opposite polarity electrodes of prior art bi-polar chucks are coupled via the charged carriers of the semiconductor and metal workpieces to provide the clamping forces for these workpieces.

Figure 6:
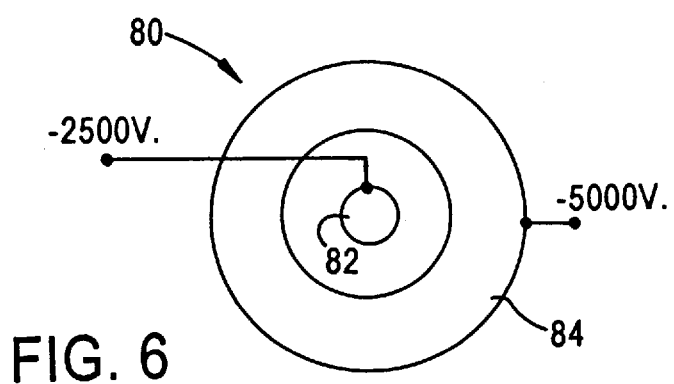
FIG. 6 is a top view of a center disc and peripheral ring electrode arrangement wherein the disc and ring are at different negative voltages.
Figure 7:
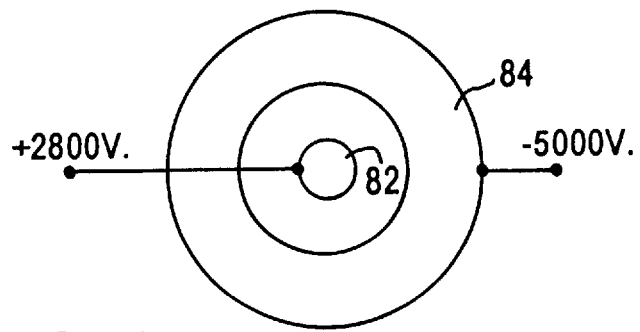
FIG. 7 is a top view of a center disc and peripheral ring electrode arrangement wherein the disc and ring are at different positive and negative voltages.

The use of two electrodes at different voltages enables different clamping forces to be applied to different areas of the dielectric workpiece. The values of the DC voltages applied to the different electrodes can be controlled appropriately to enable different, variable controlled forces to be applied to different spatial regions of the dielectric workpiece. One suitable electrode configuration 80 (FIGS. 6 and 7) includes a central, circular disk electrode 82 that is coaxial with and surrounded by and spaced from a planar ring electrode 84 wherein the ring electrode is at a higher DC voltage than the central electrode. For example, the central disk electrode could be at −2500 (FIG. 6) or +2800 volts (FIG. 7), and the edge ring electrode at −5000 volts. In this case the edge of the dielectric workpiece above and adjacent the ring electrode would be clamped more strongly than the center of the workpiece above and adjacent the center electrode. It is not practical to apply a positive voltage to the ring electrode because of the need to provide a substantial amount of insulation around the outer periphery of such an electrode to prevent contact of or arcing from the positive voltage electrode to the plasma. Maintaining the ring at a negative DC voltage virtually obviates the need for such insulation.

We claim:

1. A method of clamping a workpiece including a dielectric substrate to an electrostatic chuck in a vacuum plasma processor chamber, the chuck including an electrode, comprising applying the plasma to a surface of the workpiece exposed to the plasma simultaneously with applying a relatively high voltage to the electrode of the chuck while the dielectric substrate contacts the chuck, the electrode being physically arranged so it is at a high voltage which differs substantially from that of the plasma, the electrode being in close proximity to a portion of the workpiece not exposed to the plasma so (1) the electrode is at a voltage substantially different from the plasma, (2) an electrostatic charge is applied to the exposed workpiece surface by the plasma, and (3) an electrically conductive path is provided via the plasma from the exposed workpiece to a terminal at a potential substantially different from the voltage applied to the electrode, the high voltage, the electrostatic charge and the electrically conducting path being such that they cause an electrostatic force to be developed from the electrostatic charge on the workpiece exposed surface through the dielectric substrate to the electrode, the electrostatic force being sufficient to clamp the workpiece to the chuck and overcome other forces having a tendency to move the workpiece relative to the chuck.

2. The method of claim 1 wherein the voltage is DC and is high enough to cause sufficient electrostatic force to be applied through the thickness of the dielectric substrate by a voltage difference between the DC voltage applied to the electrode and charge applied by the plasma to the exposed face to hold the workpiece on the chuck.

3. The method of claim 2 wherein a plurality of said electrodes are provided, and applying the same DC voltage to each of said plural electrodes.

4. The method of claim 2 wherein a plurality of said electrodes are provided, and applying different DC voltages to different ones of said plural electrodes.

5. The method of claim 4 wherein the voltages have the same polarity.

6. The method of claim 4 wherein the voltages have differing polarities.

7. The method of claim 4 further including changing the values of the different DC voltages of the same polarity applied to different ones of said plural electrodes.

8. The method of claim 1 further including controlling the temperature of the workpiece by feeding a fluid through the chuck.

9. The method of claim 8 wherein the fluid is a gas that is applied via the chuck to a portion of the dielectric substrate not exposed to the ions, the applied gas having a tendency to bow the workpiece away from the chuck, the bowing tendency being overcome by the electrostatic force resulting from the voltage being applied to the electrode while the gas is applied to the chuck.

10. The method of claim 9 wherein the voltage is DC and has a magnitude of at least $$\frac{2d}{\epsilon_r} \left[ \frac{p}{\epsilon_o} \right]^{\frac{1}{2}}$$

where
  d=thickness of the substrate
  $\epsilon_r$=permittivity of the substrate
  $\epsilon_o$=permittivity of free space
  P=pressure applied to the workpiece by the gas.

11. The method of claim 8 wherein the fluid is a liquid that flows through the chuck to cool the holder, and transferring a thermal effect provided by cooling the chuck to the workpiece by thermal conduction through the chuck.

12. The method of claim 1 wherein the dielectric is such and the voltage is DC and is sufficiently high relative to charge on the exposed surface to cause displacement current to flow between the electrode and the charge on the exposed surface.

13. The method of claim 1 wherein the voltage applied to the electrode is DC and only has a negative polarity relative to the plasma.

14. The method of claim 1 wherein the substrate consists of glass, and further including processing the workpiece while the workpiece is clamped to the chuck, the processing including forming field effect transistor type devices on the workpiece, the substrate, voltage and formed field effect transistor type devices being such that the voltage across the field effect transistor type devices is sufficiently low to prevent damage to the field effect transistor type devices.

15. The method of claim 14 wherein the workpiece processing includes applying resist material to the workpiece to form a flat panel display, and cooling the workpiece while said workpiece is being processed by supplying cooling fluid to a face of the workpiece opposite from the exposed surface, the cooling being sufficient to prevent reticulation of the resist.

16. The method of claim 15 wherein the gas has a tendency to bow the workpiece away from the chuck, the bowing tendency being overcome by the electrostatic force resulting from the voltage being applied to the electrode while the gas is applied to the chuck.

17. The method of claim 1 wherein the workpiece is placed on the chuck and the chuck is arranged in such a manner that no portion of the electrode is exposed to the plasma.

18. In combination, a vacuum plasma processor chamber for applying gaseous ions having a potential substantially equal to a reference potential to an exposed surface of a workpiece including a dielectric substrate, an electrostatic chuck in the chamber for contacting the dielectric substrate and holding the workpiece in situ in the chamber, the electrostatic chuck having an electrode, means for maintaining the electrode at a potential substantially different from the reference potential; the potential at which the electrode is maintained being such, and the electrode being positioned relative to the workpiece surface while the plasma is being applied to the exposed workpiece surface so that electric charge applied to the exposed surface by the plasma forms part of an electrically conducting path from the exposed surface to a terminal at the reference potential via the plasma so the charge on the surface is at a potential substantially equal to the reference potential and a substantial voltage is established between the electrode and the charge on the surface, the substantial voltage establishing an electrostatic clamping force from the electrode through the substrate to the charge on the surface for holding the workpiece in situ on the chuck and overcome other forces having a tendency to move the workpiece relative to the chuck, and means for feeding a fluid through the chuck for controlling the workpiece temperature.

19. The combination of claim 18 wherein the substrate consists of a glass plate and the exposed surface is a substantially planar glass face, the substrate having a rear face to be clamped to the electrostatic chuck, and the electrode comprises a metal plate having a substantially planar face facing the rear face of the substrate and located in a plane parallel to the exposed surface, an electric insulator surrounding a surface of the electrode for preventing the electrode from electrically contacting the ions in the chamber while the workpiece is in situ on the chuck.

20. The combination of claim 19 wherein the electrode face is bare so the electrode face and a face of the dielectric plate opposite from the exposed face abut and the electric insulator surrounds surfaces of the electrode except portions of the planar face of the metal plate facing the rear face of the substrate.

21. The combination of claim 19 wherein the electrode face is covered by a protective coating, the protective coating having a face abutting a face of the workpiece opposite from the exposed face and preventing ions in the plasma from electrically contacting the electrode while the voltage is applied to the electrode.

22. The combination of claim 21 wherein the protective coating is a semiconductor.

23. The combination of claim 21 wherein the protective coating is a semi-metal.

24. The combination of claim 21 wherein the protective coating is a thin dielectric layer.

25. The combination of claim 19 wherein the voltage applied to the electrode is DC and only has a negative polarity relative to the plasma.

26. The combination of claim 19 wherein the electrode has a face arranged to abut a surface of the substrate opposite from the exposed surface, said face being arranged to apply to the workpiece a gas for controlling the temperature of the clamped workpiece.

27. The combination of claim 18 wherein the dielectric is such and the voltage is DC and is sufficiently high relative to charge on the exposed surface to cause displacement current to flow between the electrode and the charge on the exposed surface.

28. The combination of claim 18 wherein the fluid is a gas, the chuck including a conduit for applying the gas to a portion of the dielectric substrate not exposed to the ions, the applied gas having a tendency to bow the workpiece away from the chuck, the bowing tendency being overcome by the electrostatic force resulting from the voltage being applied to the electrode while the gas is applied to the chuck.

29. The combination of claim 28 wherein the voltage is DC and has a magnitude of at least $$\frac{2d}{\epsilon_r}\left[\frac{P}{\epsilon_o}\right]^{\frac{1}{2}}$$

where
d=thickness of the substrate
$\epsilon_r$=permittivity of the substrate
$\epsilon_o$=permittivity of free space
P=pressure applied to the workpiece by the gas.

30. Apparatus for clamping a workpiece including a dielectric substrate in a vacuum plasma processor chamber comprising an electrostatic chuck in the chamber for contacting the dielectric substrate and holding the workpiece, the chuck including an electrode, means for applying the plasma to a surface of the workpiece exposed to the plasma, a relatively high single polarity voltage source connected to the electrode of the chuck, the electrode being physically arranged so it is at a high voltage which differs substantially from that of the plasma, the electrode being in close proximity to a portion of the substrate not exposed to the plasma so (1) the electrode is at a DC voltage substantially different from the plasma, (2) a DC electrostatic charge is applied to the exposed workpiece surface by the plasma, and (3) an electrically conductive path is provided via the plasma from the exposed substrate surface to a terminal at a potential substantially different from the voltage applied to the electrode, the electrostatic charge and the electrically conducting path being such that they cause an electrostatic force to be developed between the workpiece the chuck electrodes, the electrostatic force being applied from the electrostatic charges through the thickness of the dielectric substrate to the electrode by a voltage difference between the DC voltage applied to the electrode and charge applied by the plasma to the exposed face to hold the workpiece on the chuck.

31. The apparatus of claim 30 wherein a plurality of said electrodes are provided, the same DC voltage being connected to each of said plural electrodes.

32. The apparatus of claim 30 wherein a plurality of said electrodes are provided, different DC voltages of the same polarity being connected to different ones of said plural electrodes.

33. The apparatus of claim 30 wherein a plurality of said electrodes are provided, different DC voltages of differing polarities being connected to different ones of said plural electrodes.

34. The apparatus of claim 30 wherein said chuck includes only one electrode.

35. The apparatus of claim 30 wherein the dielectric is such and the voltage is DC and is sufficiently high relative to charge on the exposed surface to cause displacement current to flow between the electrode and the charge on the exposed surface.

36. The apparatus of claim 30 wherein the voltage applied to the electrode only has a negative polarity relative to the plasma.

37. The apparatus of claim 30 wherein the chuck includes a conduit arrangement for applying a temperature control gas to a face of the dielectric substrate opposite from the surface exposed to the plasma, the gas exerting a pressure on the substrate face tending to push the substrate away from the chuck, the voltage being sufficiently high to overcome the tendency and having a magnitude equal at least to:

$$\frac{2d}{\epsilon_r} \left[ \frac{P}{\epsilon_o} \right]^{\frac{1}{2}}$$

where d=thickness of the substrate $\epsilon_r$=permittivity of the substrate $\epsilon_o$=permittivity of free space P=pressure applied to the workpiece by the gas.

\* \* \* \* \*